United States Patent

Matsubayashi et al.

[11] Patent Number: 5,857,397
[45] Date of Patent: Jan. 12, 1999

[54] SHEET MACHINING APPARATUS

[75] Inventors: Satoshi Matsubayashi, Kitakyusyu; Hiroyuki Tsuji, Nagoya; Kazumasa Kitamura, Ichinomiya; Motoo Noritake, Nagoya, all of Japan

[73] Assignees: NGK Insulators, Ltd.; Mitsui High-Tec, Inc., both of Japan

[21] Appl. No.: 772,118

[22] Filed: Dec. 20, 1996

[30] Foreign Application Priority Data

Dec. 25, 1995 [JP] Japan .................................... 7-337421

[51] Int. Cl.⁶ ...................................................... B26D 5/08
[52] U.S. Cl. ............................... 83/556; 83/558; 83/562; 83/221; 83/268; 83/277; 83/468.6
[58] Field of Search ............................ 83/556, 558, 562, 83/221, 227, 268, 276, 277, 468.6

[56] References Cited

U.S. PATENT DOCUMENTS

| | | | |
|---|---|---|---|
| 3,064,513 | 11/1962 | Hershey | 83/556 X |
| 3,264,915 | 8/1966 | Peterson et al. | 83/558 X |
| 3,269,241 | 8/1966 | Schott et al. | 83/562 X |
| 3,357,288 | 12/1967 | Goodman et al. | 83/558 X |
| 3,370,492 | 2/1968 | Treff | 83/556 X |
| 3,682,033 | 8/1972 | Lanahan | 83/556 X |
| 3,788,179 | 1/1974 | Vallier | 83/562 X |
| 4,052,919 | 10/1977 | McKissack | 83/221 X |
| 4,170,159 | 10/1979 | McNally | 83/562 |
| 4,257,000 | 3/1981 | Friberg | 83/558 X |
| 4,555,966 | 12/1985 | Klingel | 83/221 X |
| 4,653,365 | 3/1987 | Takasaki et al. | 83/560 X |
| 4,674,376 | 6/1987 | Hattori et al. | 83/285 |
| 4,741,429 | 5/1988 | Hattori et al. | 198/456 |
| 4,791,721 | 12/1988 | Anderson et al. | 29/829 |
| 4,821,614 | 4/1989 | Fleet et al. | 83/552 X |
| 5,395,106 | 3/1995 | Tohnai et al. | 271/258 |

FOREIGN PATENT DOCUMENTS

| | | |
|---|---|---|
| 162 290 | 11/1985 | European Pat. Off. . |
| 236 766 | 9/1987 | European Pat. Off. . |
| 6-188309 | 7/1994 | Japan .................................... 83/556 |

OTHER PUBLICATIONS

IBM Technical Disclosure Bulletin, vol. 24, No. 11b, Apr. 1982, New York, pp. 6017–6019, XP002027913 "Process for the Testing the Operation of an Indexable via Punching Apparatus" (includes Figures 1 & 2).

IBM Technical Disclosure Bulletin, vol. 16, No. 12, May 1974, New York, p. 3921 XP002027914 "Programmable Cluster Punching System" (Figure Included).

*Primary Examiner*—M. Rachuba
*Attorney, Agent, or Firm*—Parkhurst & Wendel

[57] ABSTRACT

A sheet machining apparatus has a die for positioning a sheet to be machined. The die is mounted on a lower die base for movement and has a machining pattern for the sheet, a plurality of punches are mounted on an upper punch base for machining the sheet in coaction with the die in a predetermined number of machining cycles according to the individual machining pattern, and a feed mechanism horizontally moves the die to align a machining position on the sheet with the punches each time the sheet is machined by the die and the punches.

4 Claims, 6 Drawing Sheets

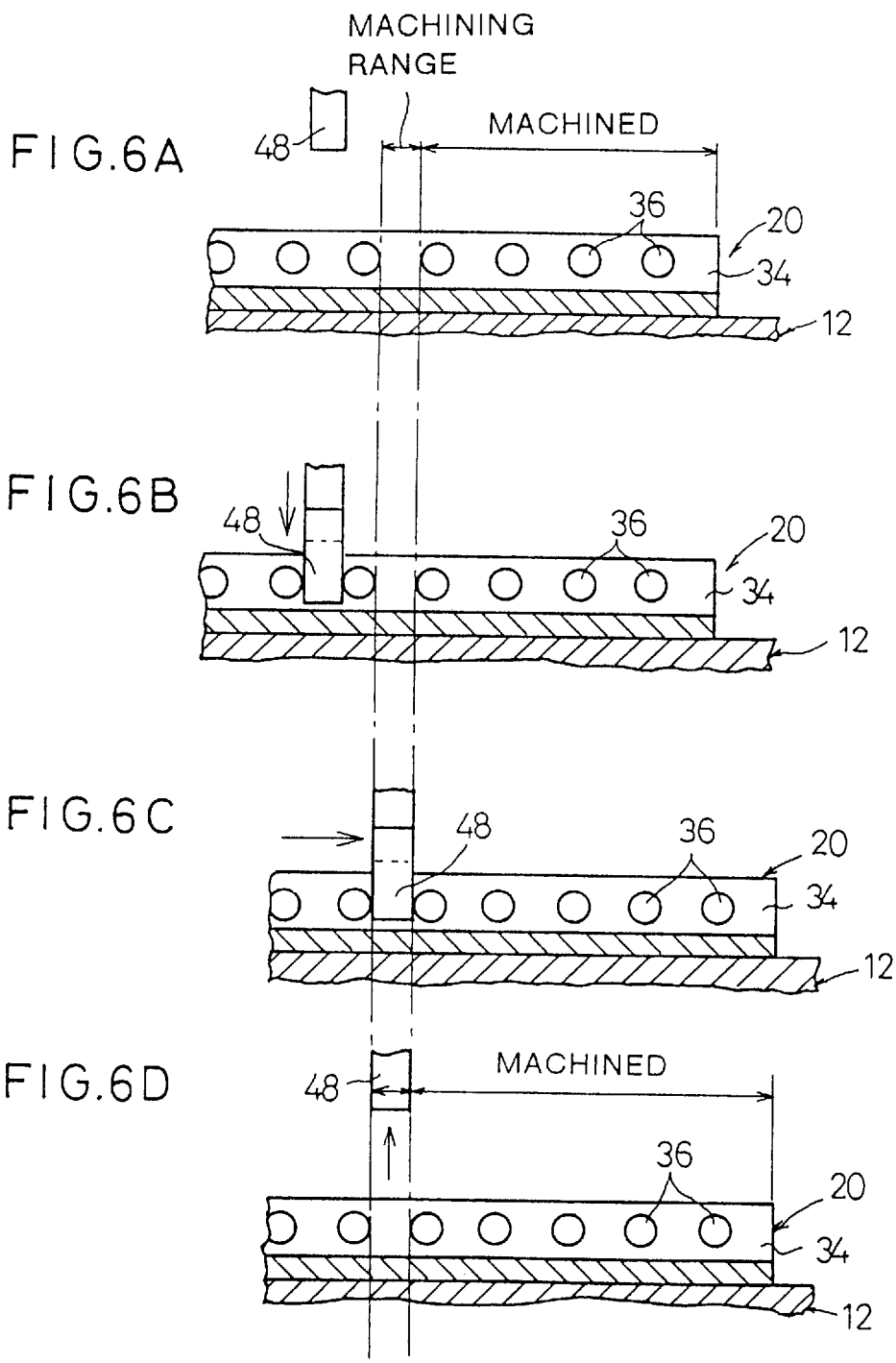

SHEET MACHINING APPARATUS

BACKGROUND OF THE INVENTION

1. Field of the Invention

The present invention relates to an apparatus for machining a sheet with a die and a punch.

2. Description of the Related Art

Various dies or machining apparatus have generally been used to punch holes or openings in workpieces. For example, there is a prior art progressive die assembly having dies and punches movable toward and away from each other for successively punching holes in a workpiece that is being fed through the dies and punches. There is also a compound blank-and-punch die assembly for blanking and punching a workpiece at once with a die which has holes according to a machining pattern for the workpiece, and as many punches as the number of those holes in the die.

In the prior art progressive die assembly, since only the workpiece is moved, external forces are applied to move the workpiece. The workpiece is normally spaced from the dies so that it can be fed successively through the dies and punches. Therefore, the workpiece is subject to external forces when it is punched by the punches. If the workpiece comprises a thin and/or soft sheet, then the sheet tends to be strained by the external forces applied to move the sheet and also the external forces applied to punch the sheet. When the sheet is strained, it reduces the dimensional accuracy of holes punched therein, particularly if many small holes are punched in the sheet, and it cannot be fed at a highly accurate rate through the dies and punches.

The compound blank-and-punch die assembly has as many punches as the number of holes in the die according to the machining pattern for the workpiece. If the machining pattern has many small holes, then the compound blank-and-punch die assembly is required to have as many punches of small diameters as the number of the holes in the die. It is relatively expensive to manufacture such punches of small diameters, and such punches of small diameters are liable to be damaged in use. As a result, the compound blank-and-punch die assembly with many punches of small diameters needs a considerably complex maintenance process.

SUMMARY OF THE INVENTION

It is therefore an object of the present invention to provide a sheet machining apparatus which is capable of machining various sheets highly accurately and which is relatively simple in structure.

To achieve the above object, according to the present invention, a sheet machining apparatus has a die which has a machining pattern and an array of punches. A sheet mounted on the die and the die are moved relative to each other by a feed mechanism, and the sheet is machined at successive positions thereon by the die and the punches in successive machining cycles. Since the sheet moves in unison with the die, no undue external forces are applied to the sheet when it is machined. Therefore, even if the sheet is a thin and/or soft sheet, it is prevented from being unduly strained when it is machined. As the number of punches is relatively small, the sheet machining apparatus can be manufactured relatively inexpensively and serviced according to a relatively simple maintenance process.

The sheet machining apparatus also has a delivery means for delivering the die with the sheet placed thereon by a predetermined distance for each machining cycle, and a positioning means for positioning the die with respect to the punches. As a consequence, the die and the punches can accurately be adjusted with respect to their relative position, allowing the sheet to be machined with high accuracy.

The above and other objects, features, and advantages of the present invention will become apparent from the following description when taken in conjunction with the accompanying drawings in which a preferred embodiment of the present invention is shown by way of illustrative example.

BRIEF DESCRIPTION OF THE DRAWINGS

FIG. 6A is an enlarged fragmentary vertical cross-sectional view showing a die before it is moved with respect to a lower die base;

FIG. 6B is an enlarged fragmentary vertical cross-sectional view showing a finger inserted between two adjacent rollers on the die;

FIG. 6C is an enlarged fragmentary vertical cross-sectional view showing the die after it is moved one pitch with respect to the lower die base; and FIG. 6D is an enlarged fragmentary vertical cross-sectional view showing the die which is positioned with a new machining position on the sheet being aligned with the punches.

DETAILED DESCRIPTION OF THE PREFERRED EMBODIMENT

Figure 1:
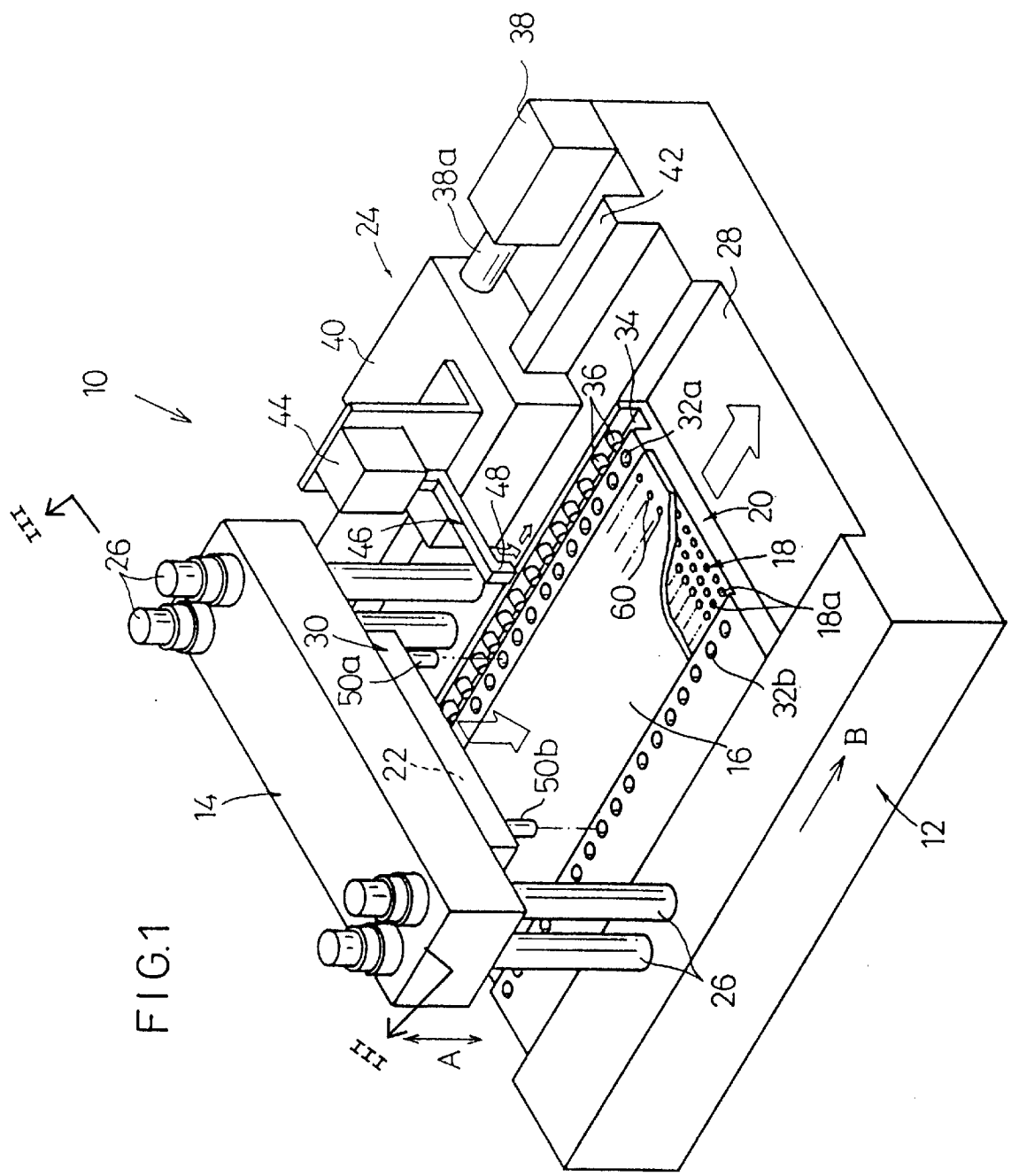
FIG. 1 is a perspective view of a sheet machining apparatus according to the present invention.

As shown in FIG. 1, a sheet machining apparatus 10 according to the present invention has a fixed lower die base 12, an upper punch base 14 that moves vertically toward and from the lower die base 12 in the directions indicated by the arrow A. A movable die 20 supports a sheet 16 to be machined and located on the lower die base 12 for horizontal movement in the directions indicated by the arrow B. The die 20 having a machining pattern 18 for machining, i.e., punching, the sheet 16, an array of punches 22 supported on the upper punch base 14 for punching the sheet 16 according to the machining pattern 18 in a predetermined number of machining cycles, and a feed mechanism 24 for moving the die 20 with the sheet 16 mounted thereon in the direction indicated by the arrow B. This allows for alignment of the next machining position on the sheet 16 with the array of punches 22 each time the sheet 16 is punched by the die 20 and the array of punches 22 in a machining cycle.

The upper punch base 14 is movable and vertically movably supported above the lower die base 12 by four main posts 26. The lower die base 12 has a guide groove 28 defined in an upper surface below the upper punch base 14, which extends in the direction indicated by the arrow B. The die 20 is movably received in the guide groove 28 and has two arrays of positioning holes 32a, 32b defined in an upper surface thereof and positioned one on each side of the machining pattern 18. The positioning holes 32a, 32b are spaced at equal intervals in the direction indicated by the arrow B. The positioning holes 32a, 32b serve as the first part of a positioning means 30 for positioning the die 20 with respect to the punches 22.

The die 20 has a slot 34 defined in an upper surface thereof along a side edge adjacent to the array of positioning holes 32a in the direction indicated by the arrow B. The slot 34 houses an array of equally spaced rollers 36 that are rotatable about respective horizontal axes.

Figure 2:
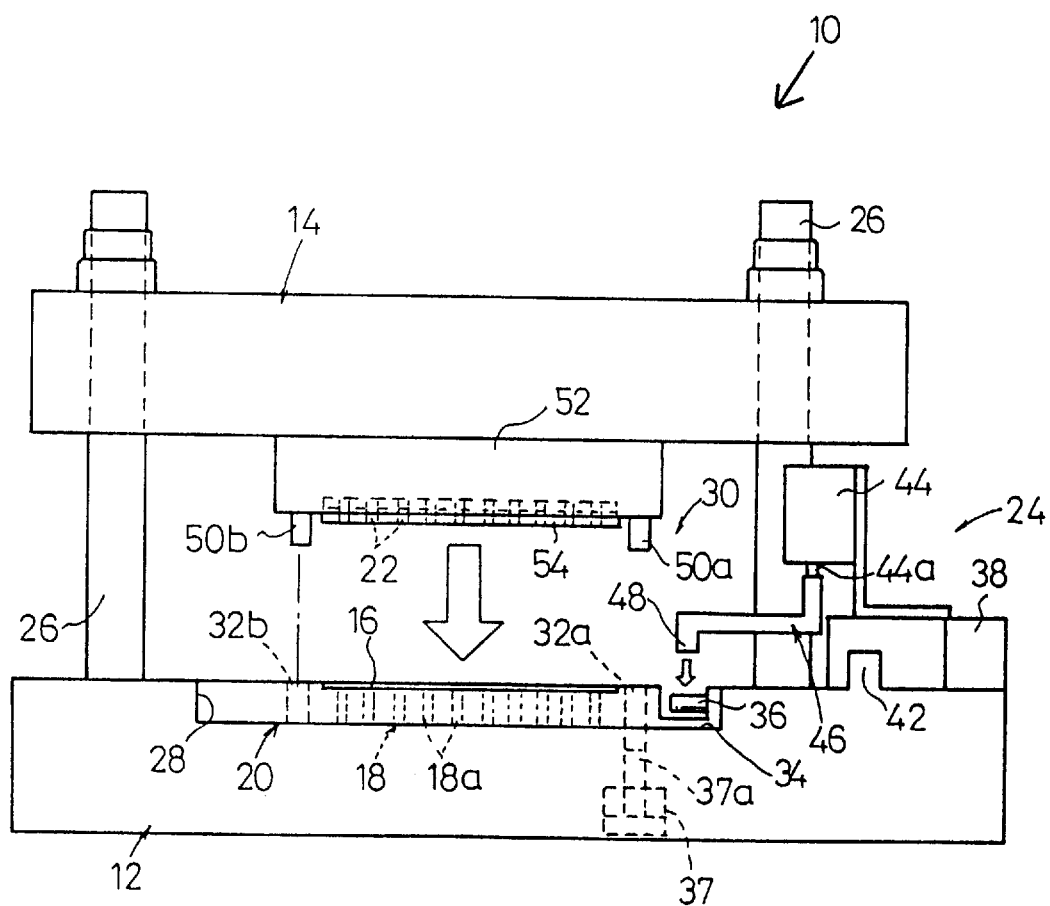
FIG. 2 is a side elevational view of the sheet machining apparatus.
Figure 3:
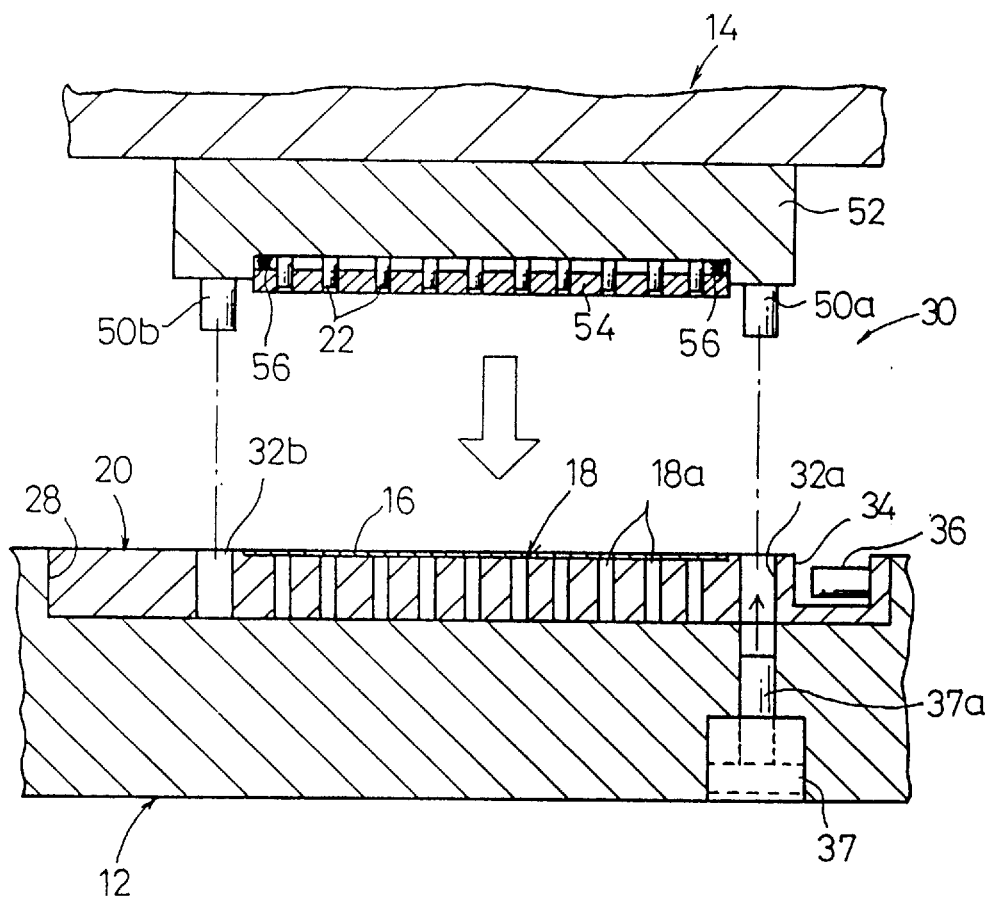
FIG. 3 is a vertical cross-sectional view of the sheet machining apparatus, showing an upper punch base and a lower die base which are moved away from each other.

As shown in FIGS. 2 and 3, the lower die base 12 has a positioning cylinder 37 mounted therein underneath the guide groove 28 and having an upwardly extending rod 37a which can be fitted into one of the positioning holes 32a in the die 20 at a time.

As shown in FIG. 1, the feed mechanism 24 includes a first cylinder 38 having a rod 38a extending in a direction opposite to the direction indicated by the arrow B. The rod 38a has a distal end coupled to a movable table 40 which is movably disposed on a rail 42 projecting upwardly from the lower die base 12 and extending parallel to the first cylinder 38.

The feed mechanism 24 also includes a second cylinder 44 mounted on the movable table 40 and having a downwardly extending rod 44a (see FIG. 2) to which an end of an engaging arm (delivery means) 46 is coupled. The engaging arm 46 extends horizontally to a position above the slot 34 and has on its opposite end a finger 48 projecting downwardly for being placed between two rollers 36.

The upper punch base 14 has two auxiliary posts 50a, 50b horizontally spaced from each other for being selectively inserted into the positioning holes 32a, 32b in the die 20. The auxiliary posts 50a, 50b serve as the second part of the positioning means 30.

Figure 4:
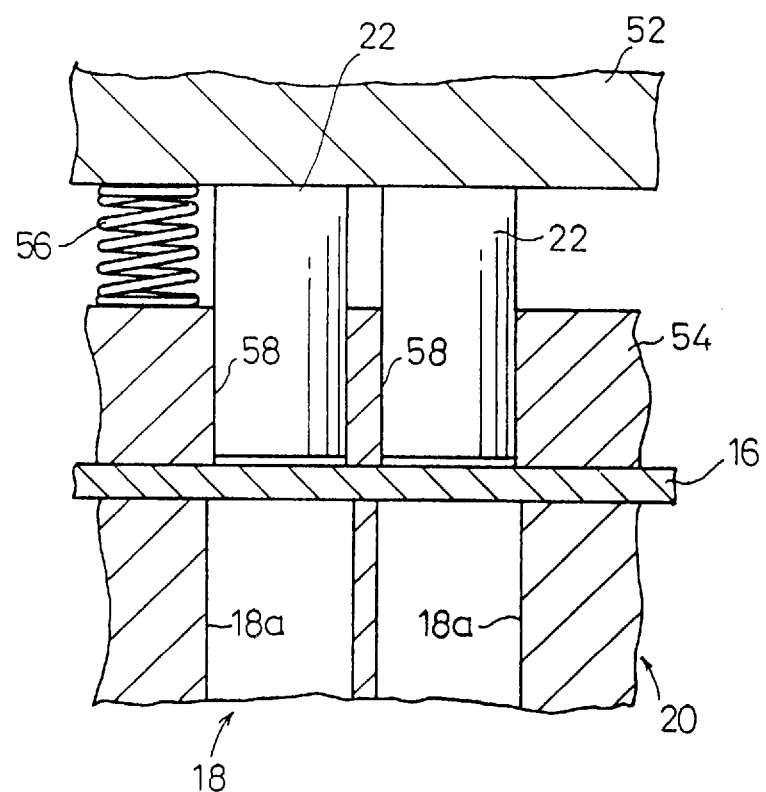
FIG. 4 is an enlarged fragmentary vertical crosssectional view of the sheet machining apparatus, showing punches entering corresponding holes.

As shown in FIGS. 2 and 3, the punches 22 are supported on a lower surface of a punch holder 52 which is mounted on a lower surface of the upper punch base 14. A stripper 54 is also mounted on the lower surface of the upper punch base 14 for vertical movement with respect to the punches 22. The stripper 54 is normally biased to move downwardly by springs 56. As shown in FIG. 4, the stripper 54 has an array of punch guide holes 58 which receive the punches 22, respectively. The punch guide holes 58 have a diameter that is smaller than the diameter of holes 18a defined in the machining pattern 18.

Operation of the sheet machining apparatus 10 will be described below.

As shown in FIGS. 1 through 3, the sheet 16 is placed on the die 20 while the upper punch base 14 is being elevated off the lower die base 12. Then, the positioning cylinder 37 is operated to insert the rod 37a into one of the positioning holes 32a for thereby temporarily positioning the die 20 with respect to the lower die base 12.

Figure 5:
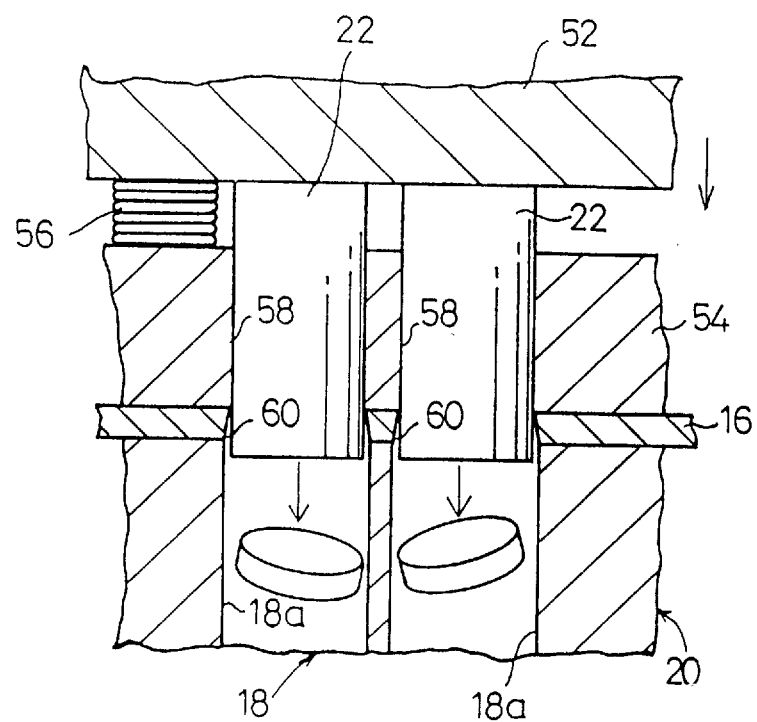
FIG. 5 is an enlarged fragmentary vertical cross-sectional view showing the manner in which holes are punched in a sheet by the sheet machining apparatus.

Then, the upper punch base 14 is lowered along the main posts 26 toward the lower die base 12. The auxiliary posts 50a, 50b are fitted in respective ones of the positioning holes 32a, 32b. The die 20 is now accurately positioned relatively to the upper punch base 14, as shown in FIG. 4. While the sheet 16 on the die 20 is being pressed by the stripper 54 which are biased by the springs 56, the sheet 16 is punched by the punches 22, forming holes 60 in the sheet 16 at a certain machining position thereon, as shown in FIGS. 5 and 6A.

Thereafter, the upper punch base 14 is lifted, and the positioning cylinder 37 is operated to retract the rod 37a out of the positioning hole 32a. The second cylinder 44 is operated to lower the engaging arm 46 with its rod 44a until the finger 48 is inserted between two rollers 36, as shown in FIG. 6B. The first cylinder 38 is then actuated to cause the rod 38a to move the movable table 40 a predetermined distance in the direction indicated by the arrow B. The die 20 is now moved a given distance, e.g., the pitch between the rollers 20, in the direction indicated by the arrow B by the finger 48 engaging the rollers 36, as shown in FIG. 6C.

Then, the positioning cylinder 37 is operated to insert the rod 37a into another one of the positioning holes 32a. The engaging arm 46 is lifted by the second cylinder 44, and then returned together with the movable table 40 to a given standby position by the first cylinder 38. The sheet 16 on the die 20 is positioned with its new machining position aligned with the punches 22, as shown in FIG. 6D.

The punches 22 are lowered to form another array of holes 60 in the sheet 16 at the new machining position in the manner described above. After the sheet 16 is punched in its entirety according to the machining pattern 18, the sheet 16 is removed from the die 20.

As described above, the sheet 16 is placed on the machining pattern 18 of the die 20, and then is intermittently fed together with the die 20 in the direction indicated by the arrow B by the feed mechanism 24, during which time the sheet 16 is punched by the punches 22 and the die.

Since sheet 16 is moved in unison with the die 20 in intimate contact therewith at all times, no abrupt external forces are applied to the sheet 16. Even if the sheet 16 is a thin and soft sheet, it is prevented from being unduly strained when it is punched by the punches 22 and the die. Therefore, the sheet 16 can be machined with the machining accuracy of the machining pattern 18 even if it is a fine punching pattern, so that the holes 60 can be formed highly accurately and efficiently in the sheet 16.

Inasmuch as the number of punches 22 is relatively small, e.g., the punches 22 may be provided in a single array, the cost of the sheet machining apparatus 10 is relatively low, and hence any maintenance process required for servicing the sheet machining apparatus 10 when any of the punches 22 are damaged or reach the end of their service life. Because the accuracy of the holes 60 depends upon the dimensional accuracy of the punches 22, undue variations in the accuracy of the holes 60 are relatively small as the number of punches 22 is relatively small.

If the machining pattern 18 is a pattern for punching many small holes, the punches 22 are usually fabricated by a grinding process and the holes 18a are usually formed by a discharging process. Therefore, the service life of the die 20 tends to be relatively short due to the presence of a modified layer generated in the discharging process. Since the punches 22 are used more frequently than the holes 18a, the times for maintenance for the punches 22 and the die 20 are substantially in agreement with each other. As a consequence, the maintenance process for the punches 22 and the die 20 can be carried out efficiently.

In the illustrated embodiment, the feed mechanism 24 has the first and second cylinders 38, 44 to move the engaging arm 46. However, the feed mechanism 24 may comprise a computerized numerical control (CNC) device including a CNC actuator for positioning the die 20 with respect to the lower die base 12. If such a CNC device is employed, then it is preferable that the die 20 and the CNC actuator be displaceable with respect to each other in a predetermined range in view of relative positioning errors which may be caused by the lower die base 12 and the die 20.

The sheet machining apparatus 10 has the delivery means for delivering the die 20 with the sheet 16 placed thereon by a predetermined distance for each machining cycle, and the positioning means for positioning the die 20 with respect to the punches 22. As a consequence, the die 20 and the punches 22 can accurately be adjusted with respect to their relative position, allowing the sheet 16 to be machined with high accuracy.

Although a certain preferred embodiment of the present invention has been shown and described in detail, it should be understood that various changes and modifications may be made therein without departing from the scope of the appended claims.

What is claimed is:

1. A sheet machining apparatus comprising:

a frame;

a die mounted on the frame for receiving a sheet to be machined, said die having a machining pattern for the sheet;

a punch head having a plurality of movable punches, the movable punches being movable reciprocally relative to said frame and toward and away from said die, for machining the sheet in coaction with said die in a predetermined number of machining cycles according to said machining pattern;

a feed mechanism for moving said die relative to said frame and to said movable punches to align at a sequential machining position of said die with said movable punches as the sheet is machined at each sequential machining position of said die by said movable punches;

means for locating on said punch head for aligning said punch head and said die during movement of the movable punches; and means for locating and holding said die at each sequential machining position before and during movement of the movable punches.

2. An apparatus according to claim 1, wherein said means for locating comprises pins on said punch head and an array of recesses on said die.

3. An apparatus according to claim 1, further comprising means for locating and holding in which a movable pin on said frame cooperates with an array of recesses on said die.

4. An apparatus according to claim 2, further comprising means for locating and holding in which a movable pin on said frame cooperates with an array of recesses on said die.

\* \* \* \* \*